(12) United States Patent
Lin

(10) Patent No.: US 6,265,252 B1
(45) Date of Patent: Jul. 24, 2001

(54) REDUCING THE FORMATION OF ELECTRICAL LEAKAGE PATHWAYS DURING MANUFACTURE OF AN ELECTRONIC DEVICE

(75) Inventor: Xi-Wei Lin, Fremont, CA (US)

(73) Assignee: VLSI Technology, Inc., San Jose, CA (US)

( * ) Notice: Subject to any disclaimer, the term of this patent is extended or adjusted under 35 U.S.C. 154(b) by 0 days.

(21) Appl. No.: 09/303,998

(22) Filed: May 3, 1999

(51) Int. Cl.⁷ .............................................. H01L 21/8234
(52) U.S. Cl. ..................... 438/197; 438/303; 438/586; 438/683; 438/714
(58) Field of Search ................................... 438/197, 233, 438/299, 303, 305, 585, 586, 596, 649, 651, 655, 682, 683, 713, 714

(56) References Cited

U.S. PATENT DOCUMENTS

| | | | |
|---|---|---|---|
| 4,432,132 | 2/1984 | Kinsbron et al. | 29/571 |
| 4,593,454 | 6/1986 | Baudrant et al. | 29/571 |
| 4,601,781 | 7/1986 | Mercier et al. | 156/643 |
| 4,638,347 | 1/1987 | Iyer | 357/54 |
| 4,776,922 | 10/1988 | Bhattacharyya et al. | 156/643 |
| 4,807,013 | 2/1989 | Manocha | 357/59 |
| 4,886,765 | * 12/1989 | Chen et al. | 438/683 |
| 4,981,810 | 1/1991 | Fazan et al. | 437/44 |
| 5,089,865 | 2/1992 | Mitsui et al. | 357/23.4 |
| 5,183,771 | 2/1993 | Mitsui et al. | 437/44 |
| 5,208,472 | 5/1993 | Su et al. | 257/344 |
| 5,233,212 | 8/1993 | Ohi et al. | 257/390 |
| 5,449,631 | 9/1995 | Giewont et al. | 437/41 |
| 5,518,958 | 5/1996 | Giewont et al. | 437/186 |
| 5,565,383 | 10/1996 | Sakai | 437/200 |
| 5,597,751 | 1/1997 | Wang | 437/43 |
| 5,648,287 | 7/1997 | Tsai et al. | 437/44 |
| 5,656,519 | 8/1997 | Mogami | 438/303 |
| 5,661,085 | 8/1997 | Teong | 438/653 |
| 5,691,212 | 11/1997 | Tsai et al. | 437/24 |
| 5,702,972 | 12/1997 | Tsai et al. | 437/56 |
| 5,705,417 | 1/1998 | Tseng | 437/44 |
| 5,739,573 | 4/1998 | Kawaguchi | 257/384 |
| 5,753,557 | 5/1998 | Tseng | 438/303 |
| 5,966,607 | * 10/1999 | Chee et al. | 438/305 |

FOREIGN PATENT DOCUMENTS

0575099 A1 12/1993 (EP) ............................. H01L/21/336

* cited by examiner

Primary Examiner—T. N. Quach
(74) Attorney, Agent, or Firm—Woodard, Emhardt, Naughton Moriarty & McNett

(57) ABSTRACT

An integrated circuit workpiece is provided having a polysilicon transistor gate member extending from a substrate. A pair of oxide spacers are formed on opposing sides of the gate member and a metal layer is deposited on the workpiece. The workpiece is heated to form a silicide region on the gate member and on selected regions of the substrate. A surface profile for each of the spacers is provided which has a progressively steeper slope from a rounded upper shoulder portion to a lower wall portion to control thickness of the metal layer on the gate member relative to thickness on the spacers. Formation of the spacers may include plasma etching with a gas mixture having from about 1 to about 20% molecular oxygen to steepen a slope of the surface profile of each of the spacers. Further, shaping of the spacers may be utilized to establish a ratio of the minimum thickness on the gate member to the minimum thickness on each spacer of at least about 2.5 to reduce silicide bridging of the spacers.

19 Claims, 3 Drawing Sheets

REDUCING THE FORMATION OF ELECTRICAL LEAKAGE PATHWAYS DURING MANUFACTURE OF AN ELECTRONIC DEVICE

BACKGROUND OF THE INVENTION

The present invention relates to electronic device manufacture, and more particularly, but not exclusively, relates to integrated circuit device manufacturing techniques that minimize electrical leakage caused by silicidation.

One common failure mechanism experienced during the manufacture of integrated circuit devices with planar insulated gate field effect transistors (IGFETs) is electrical bridging of an oxide spacer situated between the transistor gate and its corresponding source or drain. This type of defect often manifests itself as low resistance leakage that prevents proper operation of the affected IGFET. Typically, bridging of the oxide gate spacer occurs as an unintended consequence of the formation of silicide contact areas along silicon surfaces of the device.

Generally, silicide formation includes placing a metal blanket in contact with selected silicon surface regions, and then heating the device to cause a reaction between the silicon and metal. A silicide film results from this reaction along the regions of silicon/metal contact. During such silicidation processing, one possible side-effect is the occurrence of oxide-metal reactions along the oxide surface of a gate spacer. These reactions are thought to occasionally lead to the formation of a thin silicide film over the spacer, sometimes resulting in a low resistance pathway or electrical short between the gate and a source or drain region. Further, the silicide compound formed on a silicon region adjacent the spacer sometimes overflows causing a low resistance pathway or electrical short. This problem becomes even more troublesome as integrated circuit devices are scaled down to provide critical dimensions deep in the submicron range.

One way to address this problem is to reduce the thickness of the metal blanket placed in contact with the spacer. Unfortunately, an unacceptably high sheet resistance of desired silicide regions may result when the thickness of the metal blanket contacting silicon is correspondingly reduced. Thus, there is a demand for better techniques to manufacture electronic devices. These techniques preferably include the reduction of gate spacer bridging as an unwanted side-effect of silicide formation.

SUMMARY OF THE INVENTION

One form of the present invention includes providing an improved integrated circuit device. In this form, the device may include one or more components having specially shaped features.

A further form of the present invention includes an improved process for manufacturing electronic devices. Preferably, this process is applied to field effect transistors having gate spacers and silicide contact areas.

In another form, a process to preferentially reduce thickness of a layer along selected regions of an integrated circuit device workpiece is provided.

Yet another form of the present invention includes a technique to shape a spacer structure. This technique may include plasma etching of the spacer with a gas mixture that preferably comprises a predetermined amount of molecular oxygen.

Other forms of the present invention additionally or alternatively include providing an integrated circuit workpiece with a polysilicon transistor gate member extending from a substrate and forming a pair of spacers from an oxide of silicon on opposing sides of the gate member. A metal layer is deposited on the workpiece having a first minimum thickness on the gate member and a second minimum thickness on the spacers less than the first minimum thickness. The workpiece is heated to form a silicide region on the gate member. The first minimum thickness is selected to provide a target sheet resistance of the silicide region below a predetermined maximum and the second minimum thickness is selected to maintain silicide bridging of the spacers below a target level. The second minimum thickness is controlled relative to the first minimum thickness in accordance with a surface profile of each of the spacers defined during their formation. The surface profile has a progressively steeper slope from a rounded upper shoulder portion to a lower wall portion. The lower wall portion extends away from the substrate with a generally vertical slope.

In still other forms, the present invention includes providing an integrated circuit workpiece having a polysilicon transistor gate member extending from a generally planar substrate and forming a pair of spacers on opposite sides of the gate member. A metal layer is deposited on the workpiece and the workpiece is heated to form a number of silicide regions. Formation of the spacers includes plasma etching with a gas mixture. This gas mixture includes one or more fluorocarbon compounds contributing about 80–99% by volume to the mixture. Further, the mixture includes about 1–20% by volume oxygen. It has been found that this mixture may be utilized to provide a steeper spacer slope.

In still further forms of the present invention, an integrated circuit workpiece is provided that has a polysilicon transistor gate member extending from a generally planar substrate. A pair of spacers are formed on opposing sides of the gate member that are shaped during formation to define a spacer profile with a rounded upper shoulder portion downwardly curving toward a lower wall portion. The workpiece is blanketed with a metal layer that has a first minimum thickness on the gate member and a second minimum thickness on each of the spacers. The workpiece is annealed after blanketing to form a number of silicide regions. Formation of the spacers includes defining their surface profile with a slope along the lower wall portion selected to establish a ratio of the first minimum thickness to the second minimum thickness of at least about 2.5.

Further forms, objects, features, embodiments, advantages, benefits, and aspects of the present invention shall become apparent from the drawings and description contained herein.

DESCRIPTION OF THE PREFERRED EMBODIMENTS

Figure 1:
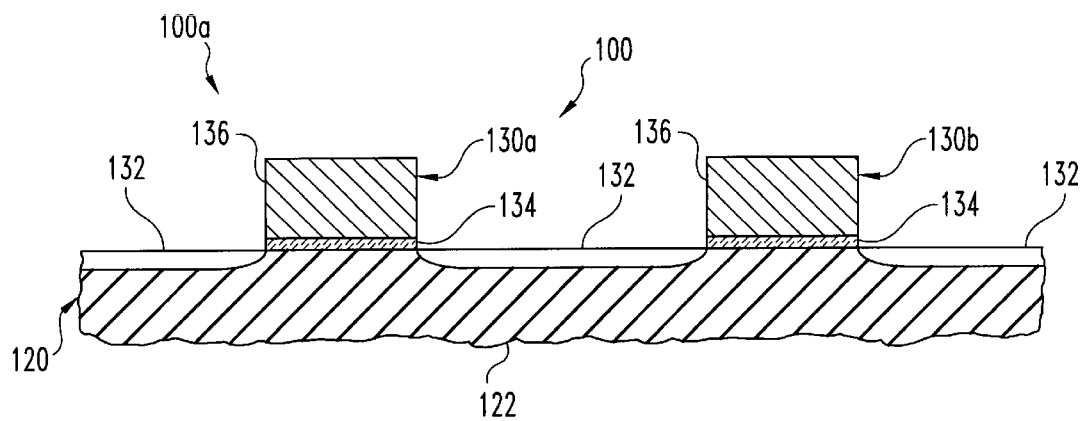
FIGS. 1–5 are partial, sectional views of selected stages of an integrated circuit device manufactured in accordance with one process of the present invention; where like reference numerals represent like features. In some cases, selected features of FIGS. 1–5 are not drawn to scale to preserve clarity and promote a better understanding of the present invention.

For the purpose of promoting an understanding of the principles of the invention, reference will now be made to the embodiments illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates.

As used herein, the terms "oxide of silicon" and "oxide" refer broadly to any material containing oxygen and silicon in any stoichiometric ratio, and may include one or more other elements. Furthermore, as used herein, the term "silicon nitride" refers broadly to any material containing silicon and nitrogen in any stoichiometric ratio, and may include one or more other elements. Also, as used herein, the term "silicon oxynitride" refers broadly to any material containing silicon, oxygen, and nitrogen in any stoichiometric ratio, and may include one or more other elements. A chemical compound formula will be utilized herein to distinguish a specific compound stoichiometry.

FIGS. 1–5 are partial, sectional views that correspond to selected stages of a manufacturing process 100 for integrated circuit device 120. Referring to stage 100a of FIG. 1, integrated circuit device 120 includes substrate 122. Substrate 122 includes silicon at or near its surface suitable for the formation of a silicide. It is preferred that substrate 122 be generally planar and formed from a wafer of a common semiconductor material, such as single-crystal silicon; however, other geometries, compositions, and arrangements of substrate 122 are also contemplated as would occur to those skilled in the art. As depicted, substrate 122 generally extends along a plane perpendicular to the view plane of FIG. 1. It is also preferred that substrate 122 be initially p- or n-doped as appropriate for the particular type of semiconductor junctions desired to be formed within substrate 122 during later processing stages.

FIG. 1 also depicts gate structures 130a and 130b each extending away from substrate 122 in a generally perpendicular direction relative to the plane of substrate 122. Structures 130a, 130b each have a dielectric gate pad 134 and corresponding gate member 136. Preferably, gate pads 134 are formed from a dielectric material suitable to form a corresponding Insulated Gate Field Effect Transistor (IGFET), such as an oxide of silicon. Gate member 136 is comprised of a material including silicon arranged in a manner suitable for subsequent silicidation processing. Preferably, gate members 136 are initially made of amorphous silicon that later becomes polycrystalline; however, in other embodiments, a different composition of members 136 may be employed as would occur to those skilled in the art.

Gate structures 130a, 130b may be simultaneously formed. In one form of this embodiment, a dielectric layer is initially deposited on substrate 122. This dielectric layer is then blanketed with a layer of amorphous silicon using standard techniques. A photoresist layer is then applied and patterned using common photolithographic techniques to provide a mask for the dielectric and amorphous silicon layers. In accordance with this mask, selected regions of these layers are removed by etching to form pads 134 from the dielectric layer and gate members 136 from the amorphous silicon layer. Gate structures 130a, 130b as shown in FIG. 1 result. Typically, the amorphous silicon is converted to a polycrystalline form (also designated "polysilicon" or "poly") by heating or annealing stages of the manufacturing process. However, in other embodiments, gate structures 130a, 130b may be provided from other materials using other techniques as would occur to those skilled in the art. Indeed, in one alternative embodiment, members 136 are comprised of multiple layers of different materials.

After formation of structures 130a, 130b, a dopant is applied to FIG. 1 to provide shallow, lightly doped substrate regions 132. Regions 132 are utilized to form Lightly Doped Drain (LDD) IGFETs for structures 130a, 130a. The conductivity type of the dopant applied to regions 132 is preferably opposite the conductivity type of any dopant applied to substrate 122 prior to stage 100a. It is also preferred that dopant be applied to regions 132 by ion implantation of one or more appropriate species. By way of nonlimiting example, Boron (B) in the form of B11 or $BF_2$ may be implanted for a p-dopant, and Arsenic (As) or phosphorus (P) may be implanted for an n-dopant. In still other examples, different species or combinations of species may be utilized as would occur to those skilled in the art. In yet other embodiments, a different doping technique may be additionally or alternatively utilized as would occur to those skilled in the art, or regions 132 may be absent.

Figure 2:
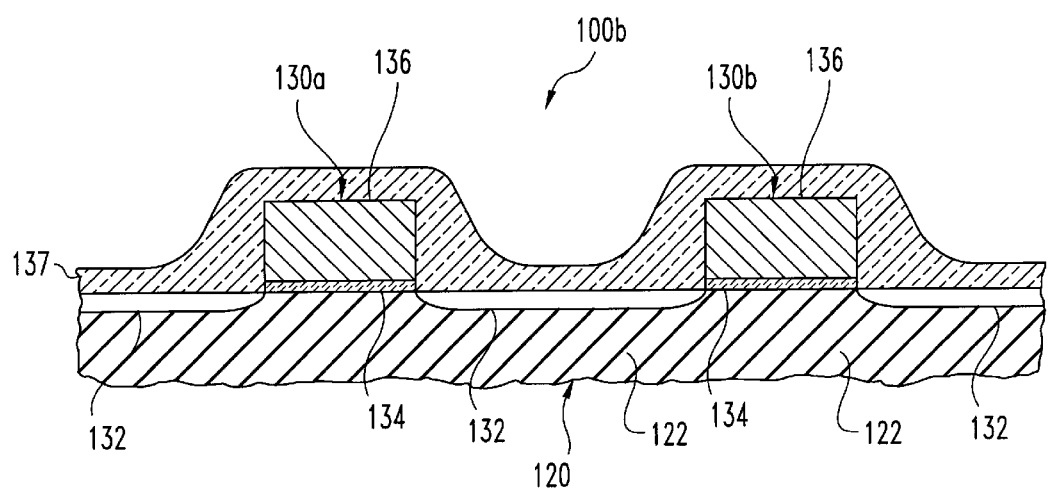

In stage 100b of FIG. 2, device 120 has been covered with layer 137 comprised of an oxide of silicon. In one preferred embodiment, layer 137 is provided by deposition of a blanket of tetraethylorthosilicate (TEOS). Layer 137 is applied to a thickness sufficient to ensure uniform, conformal coverage. After application of layer 137, further processing of device 122 preferably includes anisotropic plasma etching of layer 137 to form a pair of insulative spacers 138a, 138b for each of gate structures 130a, 130a. However, in other embodiments, a photoresist masking layer may be utilized in conjunction with other etching techniques to selectively remove layer 137 to correspondingly form spacers 138a, 138b.

Figure 3:
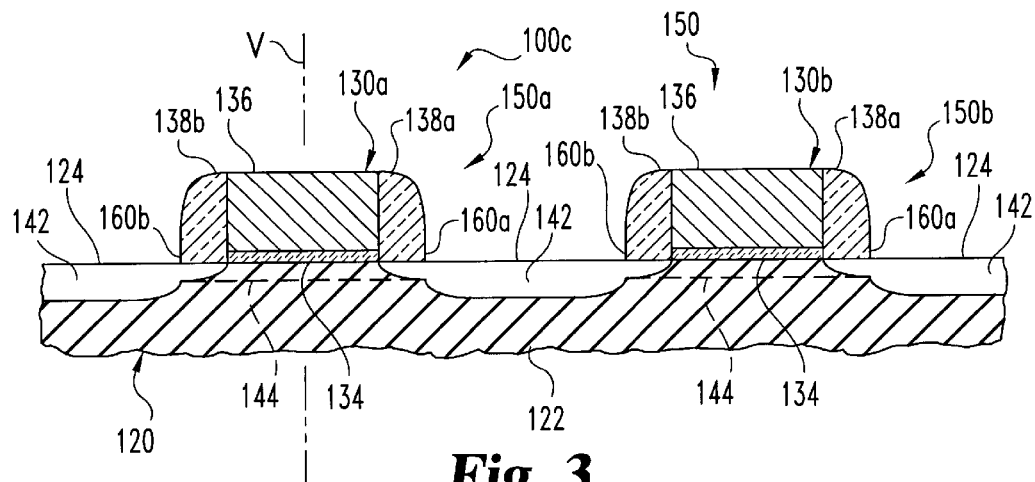

In stage 100c of FIG. 3, heavily doped substrate regions 142 are also shown. Regions 142 are preferably formed by heavily doping regions of substrate surface 124 with a dopant of the same conductivity type as used to form regions 132. Preferably, this heavy doping is also performed by implanting one or more suitable species as described in connection with stage 100a. In one more preferred embodiment, the same implant species used to form regions 132 is utilized to form regions 142, except the applied dopant level to form regions 142 is at least about one order of magnitude greater than the level applied to form regions 132. One or more of these doping procedures may be preceded by application of other films or layers, such as a screen oxide film that may subsequently be readily removed.

After doping, device 120 is annealed in stage 100c or a later stage to activate and distribute the dopant of regions 132 and 142, resulting in formation of junctions corresponding to a source and drain for each structure 130a, 130b; where the region 142 shown between structures 130a, 130b is a "shared" or "common" source or drain. Correspondingly, a channel 144 is schematically illustrated beneath pad 134 for each structure 130a, 130b in FIG. 3. Collectively, gate structures 130a, 130b; regions 142, and channels 144 comprise Insulated Gate Field Effect Transistors (IGFETs) 150a, 150a. It should be understood that IGFETs 150a, 150b are representative of just a few of the components 150 that preferably comprise device 120. Also, it should be appreciated that one or more doping procedures may be performed during earlier or later manufacturing stages relative to the formation of structures 130a, 130b or spacers 138a, 138b.

Figure 6:
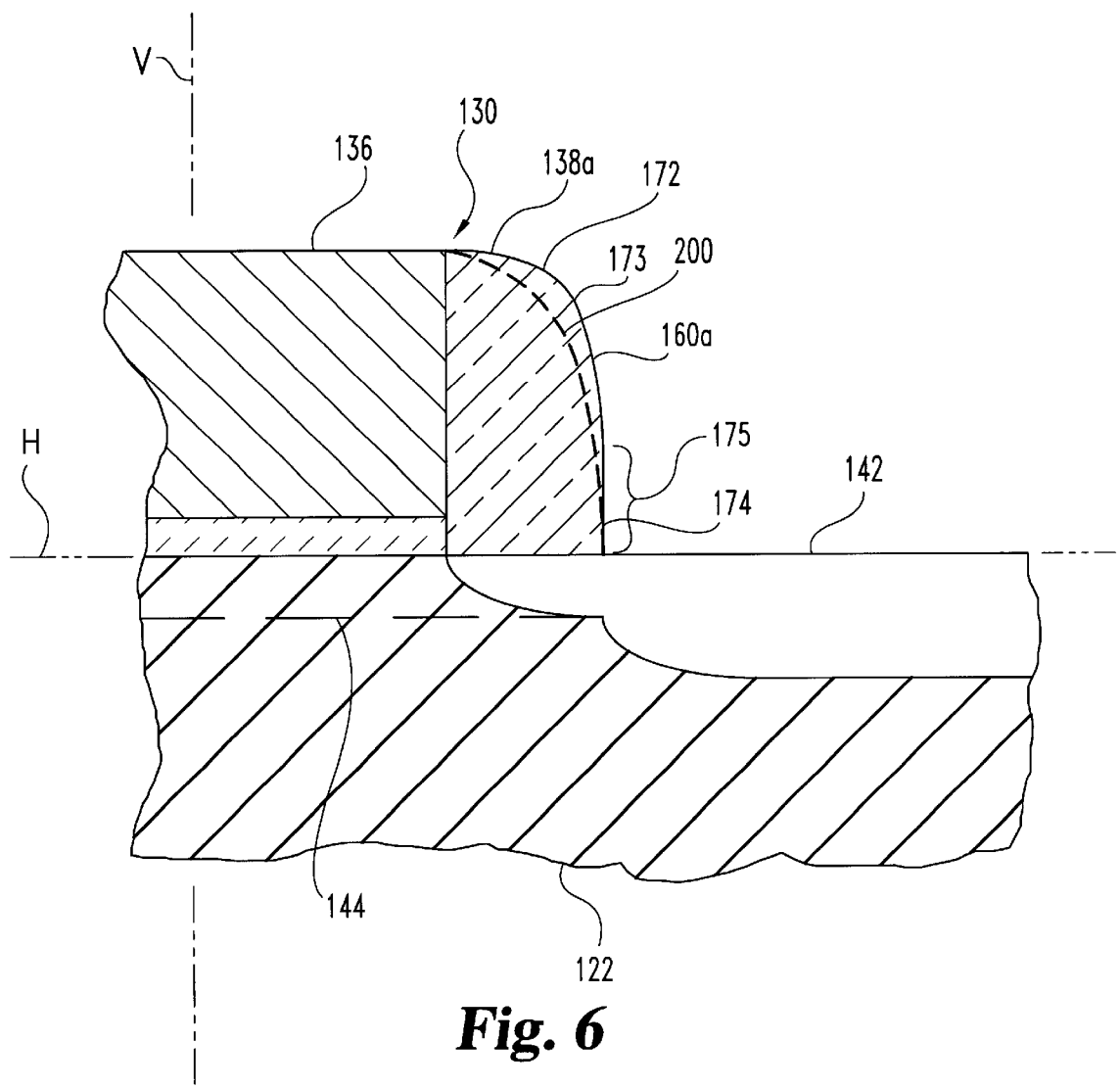
FIG. 6 is a partial, sectional side view comparing the profile of a spacer according to the present invention with the profile of a standard spacer.

Spacers 138a, 138b each have a shape designated by a cross-sectional contour or surface profile 160a, 160b, respectively. Preferably, profiles 160a, 160b are mirror images of each other about a plane that is generally parallel to vertical axis V, and positioned midway between corresponding spacers 138a, 138b. This preferred plane of symmetry is also generally perpendicular to substrate 122 and the view plane of FIG. 3. Referring additionally to FIG. 6, an enlarged view of one of spacers 138a is illustrated. FIG. 6 provides a comparison of profile 160a to standard spacer profile 200 shown in phantom. Profile 160a includes a rounded upper shoulder portion 172 and a lower wall portion 174 with a generally vertical sidewall. Notably, shoulder portion 172 corresponds to a generally smaller bend radius than the standard profile 200.

As used herein, "slope" refers to the relative value of vertical displacement divided by horizontal displacement of a point travelling along a surface contour or profile, such as profiles 160a, 160a. For a point along a curved contour, the slope may be taken with respect to a line tangent to such point. Referring to FIG. 6, the spacer slope for profile 160a progressively steepens as substrate 122 is approached from upper shoulder portion 172 to result in a substantially vertical slope for lower wall portion 174. A substantially vertical straight-line segment 175 of lower wall portion 174 is indicated in FIG. 6. In contrast, profile 200 lacks a substantially vertical line segment. Notably, profile 160a and profile 200 occupy about the same amount of distance along horizontal axis H; however, the slope of profile 160a steepens much more rapidly as compared to profile 200 to result in segment 175.

In one aspect of the present invention, it has been found that profiles 160a, 160b surprisingly reduce unwanted bridging that may arise during subsequent processing stages. This aspect is more fully described in connection with stages 100d and 100e of FIGS. 4 and 5, respectively. Alternatively or additionally, another aspect of the present invention is a technique to uniquely shape spacers 138a, 138b to provide a desired surface profile, such as profiles 160a, 160a. This technique includes a plasma etching procedure to selectively shape spacers 138a, 138b by removing portions of layer 137 in a manner that steepens the slope of each lower wall portion 174 in relation to standard profiles. Preferably, the plasma etching chemistry includes a gas mixture having about 80% to about 99% fluorocarbons by volume and about 1% to about 20% molecular oxygen by volume. A preferred composition of the fluorocarbon constituent of the gas mixture includes $CHF_3$, $CF_4$, or both. Generally, it has been found that increasing the oxygen constituent relative to the fluorocarbon constituent of the plasma gas mixture steepens spacer slope.

In one more preferred embodiment, the gas mixture has 95% to about 99% fluorocarbon by volume, about 1% to about 5% oxygen by volume, with any balance being other compounds or elements, such as Ar. For this more preferred embodiment, the fluorocarbon constituent includes $CHF_3$ in a range of about 70% to about 80% by volume and $CF_4$ in a range of about 10% to about 20% by volume. One implementation of this more preferred embodiment, is performed with plasma etching equipment having a model no. LAM 4520, that is supplied by LAM Research Corp., with a business address of 4650 Cushing Parkway, Fremont, Cailf. 94538. For this implementation, fluorocarbons are supplied to the plasma at a mass flow rate of about 45 sccm for $CHF_3$ and about 15 sccm for $CF_4$ and molecular oxygen ($O_2$) is supplied to the plasma at a mass flow rate of about 2 sccm, with the gas mixture pressure being maintained at a pressure of about 200 mTorr. Also, for this implementation, other parameters for the plasma etching process include: an RF power of about 700W; Ar gas flow of about 200 sccm; and a wafer temperature of about 10° C.

Nonetheless, it should be understood that in other embodiments, different constituents and/or relative amounts of the constituents comprising the plasma gas mixture may be utilized to provide a desired spacer profile. In yet other embodiments, a different structure besides a spacer may be shaped by plasma etching with a gas mixture including fluorocarbon and oxygen constituents. Moreover, it should be appreciated that while plasma etching in accordance with the present invention is one preferred way to provide desired profiles 160a, 160b of spacers 138a, 138b; other techniques to selectively remove layer 137 and/or shape spacers 138a, 138b as would occur to those skilled in the art are contemplated for alternative embodiments.

Figure 4:
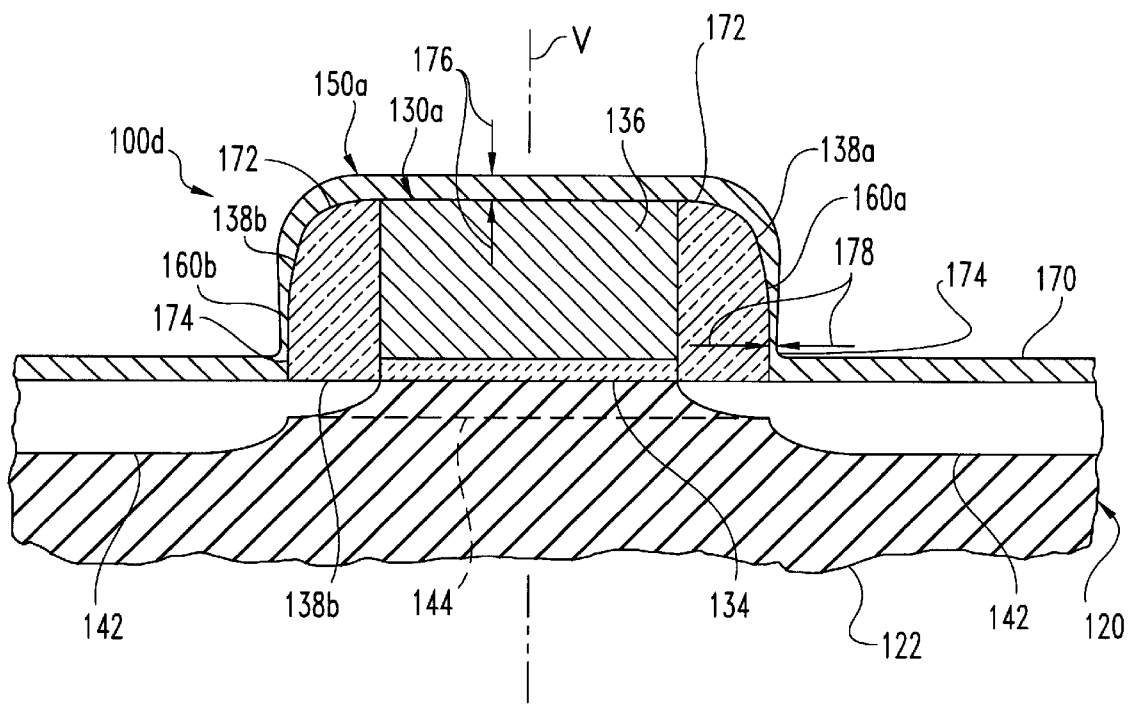

Referring to stage 100d of FIG. 4, further processing of integrated circuit device 120 includes deposition of a metal layer 170. Metal layer 170 contacts silicon of substrate 122 and member 136 for later processing to selectively form silicide contact areas. In FIG. 4, gate structure 130a is enlarged to the exclusion of gate structure 130b to more clearly illustrate surface profiles 160a, 160b of corresponding spacers 138a, 138b with respect to thickness variations of layer 170. Preferably, metal layer 170 includes one or more of titanium (Ti), tungsten (W), nickel (Ni), cobalt (Co), tantalum (Ta), or platinum (Pt). More preferably, layer 170 is comprised of titanium applied by an anisotropic, line-of-sight deposition technique, such as a collimated metal sputtering procedure. In one more preferred embodiment, a generally anisotropic, PVD metal sputtering deposition of titanium is performed with a collimator utilizing a collimation aspect ratio of about 1.5. For such a line-of-sight deposition, material travels in a generally a straight line. When this direction of travel is generally parallel to axis V, material for layer 170 generally accumulates faster on surfaces that are horizontal (that is perpendicular to axis V) as compared to surfaces oriented more vertically with respect to axis V. Correspondingly, for profiles 160a, 160b, the thickness of layer 170 significantly varies. Referring to various thickness measurements of layer 170, arrows 176 indicate a minimum thickness $T_o$ of layer 170 on members 136. Arrows 178 indicate a minimum thickness $T_s$ of layer 170 on spacers 138a, 138b. It should be appreciated that the minimum thickness $T_s$ occurs on the generally vertical, lower wall portion 174.

Figure 5:
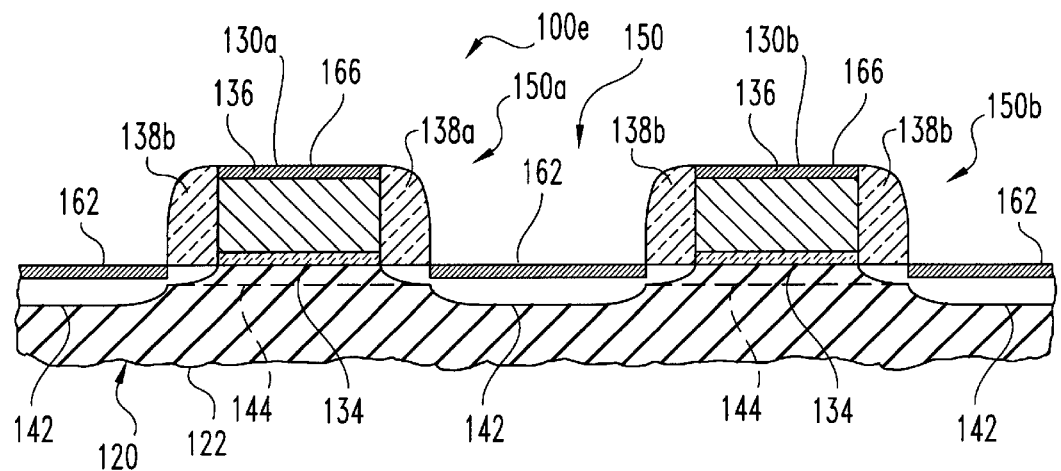

After deposition of layer 170, integrated circuit device 120 is annealed to selectively form silicide regions 162 for each region 142 and silicide region 166 for each of members 136 as shown in stage 100e of FIG. 5. Preferably, such anneals are performed while device 120 is in a nitrogen gas ($N_2$) environment. It has been found that performance of silicidation anneals in a nitrogen ambient environment tends to reduce "overflow" shorting of silicide regions 162 to regions 166. For embodiments where layer 170 comprises titanium, one preferred process for forming silicide regions 162, 166 includes applying a thickness between 200 and 400 angstroms of titanium on integrated circuit device 120. Next, a first Rapid Thermal Anncal (RTA) is performed. This first RTA heats device 120 to about 720 degrees Celsius for 30 seconds to create an intermediate silicide compound C49-$TiSi_2$ crystal structure where layer 170 contacts silicon. The unreacted metal of layer 170 is then stripped using a wet etch technique. $T_o$ provide a lower sheet resistance, a second RTA may be performed to convert the silicide crystal structure to a C54-$TiSi_2$ phase. This second RTA may be performed at about 860 degrees Celsius for about 30 seconds. In other embodiments, such as those utilizing a different composition of layer 170, a suitable silicidation procedure is performed relative to the particular material or materials utilized as would occur to those skilled in the art.

It has been found that a thickness ratio $T_o/T_s$ (or alternatively $T_o:T_s$) of at least about 2.5 provides a surprising reduction in the formation of conductive, lower resistance pathways on spacers 138a, 138b as compared to a conventional thickness ratio of about 2.0 or less. An even more preferable thickness ratio $T_o/T_s$ is at least about 2.8 to reduce shorting and bridging of spacers 138a, 138b.

Techniques of the present invention to reduce spacer bridging or shorting, that may arise due to silicidation, include preferentially depositing a metal blanket, such as layer 170, in different thicknesses relative to various strictures of integrated circuit device 120. Such techniques may include the following operations:

(a) determining a desired maximum tolerable sheet resistance $R_s$ for the silicide film to be formed;

(b) selecting a target minimum thickness $T_o$ of the metal blanket of operation (a) that will provide a sheet resistance that does not exceed R, upon subsequent silicidation processing;

(c) determining a selected minimum thickness $T_s$ for the spacers found to reduce bridging and shorting below an acceptable target level;

(d) establishing a spacer surface profile to provide the $T_o$ and $T_s$ determined in operations (b) and (c), respectively; and (e) shaping spacers to provide the profile determined in operation (d).

In operation (b), $T_o$ may be determined empirically for the metal blanket composition selected and the silicidation processing parameters utilized. Operation (c) may include calculating $T_s$ as a function of the $T_o$ selected in operation (b) in accordance with a predetermined thickness ratio $T_o/T_s$, such as 2.5, 2.8, and the like. Determination of the corresponding profile in operation (d) may be performed empirically for the given metal layer deposition procedure, composition, and subsequent silicide formation technique; where the steepness of the spacer slope is arranged to provide a smaller $T_s$ relative to $T_o$. One preferred method for performing operation (d) is the utilization of a plasma etch technique as previously described in connection with stage 100c of FIG. 3; where generally, it has been found that increasing the oxygen constituent relative to the fluorocarbon constituent of the gas mixture steepens the spacer slope.

By decreasing $T_s$ relative to $T_o$ in accordance with such techniques, it is believed that the amount of metal available for metal-oxide reactions with respect to spacer structures is reduced. In turn, formation of low resistance leakage films that bridge suicide regions 166 and 162 may be reduced. These results were experimentally confirmed for a thickness ratio $T_o/T_s$ of about 2.91. For this example, a gate structure with spacers having profiles 160a, 160b substantially as illustrated in FIG. 4 were prepared. These spacers were formed by applying the more preferred plasma etching technique described in connection with processing stage 100c to a TEOS layer. This technique was implemented with model no. LAM 4520 plasma etching equipment utilizing the corresponding flow rates and other parameters also previously described in connection with stage 100c of FIG. 3. Next, a blanket of titanium was deposited with a minimum thickness $T_o$ of about 350 angstroms on member 136 and a minimum spacer thickness $T_s$ of about 120 angstroms; where the length of spacers 38a, 38b were each about 1,000 angstroms along an axis extending generally perpendicular to the view plane of FIG. 4. The titanium metal blanket was deposited in accordance with the more preferred embodiment described in connection with stage 100d of FIG. 4. For this experimental example, a comparison was made to a gate structure prepared with conventionally shaped spacers, that was covered by the same titanium metal blanket. The shape of the spacers for the conventional gate structure resulted in a minimum spacer thickness of about 180 angstroms, resulting in a comparable thickness ratio of less than 2.0. While this specific experimental example is provided to further describe the invention, it should be appreciated that such examples are merely illustrative and are not intended to restrict or otherwise limit the scope of the present invention. Further, any theory of operation or finding stated herein is meant to further enhance understanding of the invention and is not intended to make the scope of the invention dependent on such theory or finding.

Referring to FIG. 5, after formation of suicide contact regions 162, 166, as depicted at stage 100e, one or more metallization layers may be fabricated to selectively contact and electrically interconnect components 150. Furthermore, external contact pads may be established for interconnection to other devices. Integrated circuit device 120 may be a part of a semiconductor wafer that is later separated into a number of individual integrated circuit chips after performance of selected manufacturing operations. After electrical interconnections are formed, packaging may take place, including the formation of external electrical interconnections, such as wire bonds, with any established external contact pads as appropriate.

In one more preferred embodiment, the critical dimension of each of the IGFETs 150a, 150b is less than about 0.20 microns. Also, it should be appreciated that integrated circuit device 120 is illustrated in a partial view that shows only a few representative integrated circuit components 150—namely IGFETs 150a, 150a. Other embodiments have a greater quantity or variety of integrated circuit components than depicted; however, illustrating such additional features would needlessly complicate the figures. Similarly, different active or passive integrated circuit component types as would occur to those skilled in the art may additionally or alternatively be included, but have not been specifically shown to preserve clarity. Further, a different number, arrangement, or shaping of various spacer structures in accordance with the present invention may be additionally or alternatively utilized. In another non-limiting aspect, the teachings of the present invention may be applied to any device where shaping of an oxide structure is desired. In still other embodiments, the techniques to reduce bridging may be applied to a different type of structure other than a spacer in accordance with the present invention including a device that may lack any conventional components or circuitry.

It should be noted that the implementation of the disclosed embodiments of the present invention is not limited to the depicted process flows in the figures. It is understood that the preparation of devices in accordance with the present invention may be incorporated into other process flows known to those skilled in the art. Moreover, processes of the present invention may be altered, rearranged, substituted, deleted, duplicated, combined, or added to other processes as would occur to those skilled in the art without departing from the spirit of the present invention. Additionally or alternatively, the various stages, procedures, techniques, phases, and operations within these processes may be altered, rearranged, substituted, deleted, duplicated, combined, or added as would occur to those skilled in the art.

All publications, patents, and patent applications cited in this specification are herein incorporated by reference as if each individual publication, patent, or patent application was specifically and individually indicated to be incorporated by reference in its entirety herein. While the invention has been illustrated and described in detail in the foregoing description and figures, the same is to be considered as illustrative and not restrictive in character, it being understood that only the preferred embodiments have been shown and described and that all changes, equivalents, and modifications that come within the spirit of the invention as defined by the following claims are desired to be protected.

What is claimed is:

1. A method, comprising:
    (a) providing an integrated circuit workpiece having a polysilicon transistor gate member extending from a generally olanar substrate;
    (b) forming a pair of spacers from an oxide of silicon on opposing sides of the gate member, the spacers being shaped to define a cross-sectional profike downwardly curving from the sides of the gate member towards the substrate;
    (c) depositing a metal layer on the workpiece;
    (d) heating the workpiece after said depositing to form a number of silicide regions from the metal layer; and
    wherein said forming of the spacers includes plasma etching with a gas mixture including about 80–99 percent fluorocarbon by volume and about 1–20 percent oxygen by volume to steepen a slope of the surface profile of each of the spacers to reduce silicide bridging.

2. The method of claim 1, wherein the metal layer includes titanium, tungsten, nickel, cobalt, tantalum, or platinum.

3. The method of claim 1, wherein the workpiece includes a plurality of transistor gates each having a corresponding pair of the spacers.

4. The method of claim 3, wherein each of the gates has a critical dimension of less than about 0.20 microns.

5. The method of claim 1, wherein a first minimum thickness of the metal layer is deposited on the gate member and a second minimum thickness of the metal layer is deposited on the spacers, and the second minimum thickness is less than the first minimum thickness in correspondence with steepness of the slope.

6. The method of claim 1, further comprising removing an unreacted portion of the metal layer remaining after said heating.

7. The method of claim 6, wherein the metal layer essentially consists of elemental titanium, a minimum thickness of the metal layer on the lower wall portion of each of the spacers is about 120 angstroms, a minimum thickness of the metal layer on the gate member is about 350 angstroms, and said depositing includes plasma sputtering deposition of the metal layer.

8. A method, comprising:
    (a) providing an integrated circuit workpiece with a transistor device including a polysilicon gate member extending from a substrate;
    (b) forming a pair of spacers from a material including TEOS in contact with opposing sides of the polysilicon gate member and the substrate;
    (c) depositing a metal layer on the workpiece having a first minimum thickness on the gate member and a second minimum thickness on the spacers less than the first minimum thickness;
    (d) heating the workpiece to form a silicide region on the gate member, the first minimum thickness being selected to provide a target sheet resistance of the silicide region below a predetermined maximum and the second minimum thickness being selected to maintain silicide bridging of the spacers below a target level; and
    (e) controlling the second minimum thickness relative to the first minimum thickness in accordance with a surface profile of each of the spacers defined during said forming by plasma etching with a gas mixture including about 80–99 percent fluorocarbon by volume and about 1–20 percent oxygen, the surface profile for each of the spacers having a progressively steeper slope from a rounded upper shoulder portion to a lower wall portion, the lower wall portion extending away from the substrate with a generally vertical slope.

9. The method of claim 8, wherein the fluorocarbon comprises a combination of $CHF_3$ and $CF_4$.

10. The method of claim 9, wherein the combination includes $CHF_3$ in a range of about 70% to about 80% by volume and $CF_4$ in a range of about 10% to 20% by volume.

11. The method of claim 8, wherein said depositing includes sputtering deposition of the metal layer with a collimator.

12. The method of claim 8, wherein a collimation aspect ratio of said sputtering deposition is about 1.5.

13. The method of claim 8, wherein the fluorocarbon comprises about 95% to about 99% of the gas mixture by volume and the oxygen comprises about 1% to about 5% of the gas mixture by volume.

14. The method of claim 13, wherein:
    the spacers are formed from TEOS in contact with the substrate and the gate member;
    the fluorocarbon comprises a combination of $CHF_3$ in a range of about 70% to about 80% by volume and $CF_4$ in a range of about 10% to 20% by volume; and
    said depositing includes sputtering deposition of titanium with a collimation aspect ratio of about 1.5.

15. The method of claim 13, wherein said forming including depositing a dielectric layer in contact with the substrate and the gate member, the dielectric layer being made of TEOS.

16. A method, comprising:
    (a) providing an integrated circuit workpiece with a transistor device including a polysilicon gate member extending from a substrate;
    (b) forming a pair of spacers in contact with opposing sides of the polysilicon gate member and the substrate;
    (c) depositing a metal layer on the workpiece having a first minimum thickness on the gate member and a second minimum thickness on the spacers less than the first minimum thickness;
    (d) heating the workpiece to form a silicide region on the gate member, the first minimum thickness being selected to provide a target sheet resistance of the suicide region below a predetermined maximum and the second minimum thickness being selected to maintain silicide bridging of the spacers below a target level; and
    (e) controlling the second minimum thickness relative to the first minimum thickness in accordance with a surface profile of each of the spacers defined during said forming by plasma etching with a gas mixture including about 80–99 percent fluorocarbon by volume and about 1–20 percent oxygen, the fluorocarbon being a combination of $CHF_3$ in a range of about 70% to about 80% by volume and $CF_4$ in a range of about 10% to 20% by volume.

17. The method of claim 16, wherein said depositing includes sputtering deposition of the metal layer with a collimator.

18. The method of claim 17, wherein a collimation aspect ratio of said sputtering deposition is about 1.5.

19. The method of claim 16, wherein the fluorocarbon comprises about 95% to about 99% of the gas mixture by volume and the oxygen comprises about 1% to about 5% of the gas mixture by volume.

* * * * *